Sept. 7, 1965 H. DA COSTA 3,204,327

METHOD FOR MAKING SEMICONDUCTOR DEVICES EMPLOYING A HOLLOW, SLOTTED CYLINDRICAL JIG AND VERTICAL MOUNTING POSTS

Original Filed Oct. 28, 1957 3 Sheets-Sheet 1

INVENTOR.
Harry da Costa,
BY Mueller & Aichele
Att'ys.

Sept. 7, 1965 H. DA COSTA 3,204,327

METHOD FOR MAKING SEMICONDUCTOR DEVICES EMPLOYING A HOLLOW, SLOTTED CYLINDRICAL JIG AND VERTICAL MOUNTING POSTS

Original Filed Oct. 28, 1957 3 Sheets-Sheet 2

INVENTOR.
Harry da Costa,
BY
Mueller & Aichele
Atty's.

METHOD FOR MAKING SEMICONDUCTOR DEVICES EMPLOYING A HOLLOW, SLOTTED CYLINDRICAL JIG AND VERTICAL MOUNTING POSTS

Original Filed Oct. 28, 1957 3 Sheets-Sheet 3

INVENTOR.
Harry daCosta

BY Mueller & Aichele

ATTY'S.

3,204,327

METHOD FOR MAKING SEMICONDUCTOR DEVICES EMPLOYING A HOLLOW, SLOTTED CYLINDRICAL JIG AND VERTICAL MOUNTING POSTS

Harry da Costa, Scottsdale, Ariz., assignor to Motorola, Inc., Chicago, Ill., a corporation of Illinois Original application Oct. 28, 1957, Ser. No. 692,656. Divided and this application Apr. 24, 1962, Ser. No. 190,851
6 Claims. (Cl. 29—155.5)

This is a divisional application from parent application Serial No. 692,656, filed October 28, 1957, and now abandoned, and is directed to a method of manufacturing semiconductor devices. An application on the device disclosed in the parent application was filed April 23, 1962, as Serial No. 192,617, and issued as Patent No. 3,153,751 on October 20, 1964.

This invention relates to semiconductor devices and more particularly to transistors of diminutive size whose structure permits their quick and easy assembly and to an improved method of assembling such a small article of manufacture which method is relatively simple and inexpensive, does not require the employment of highly skilled operators and yet at the same time is adapted to the production of transistors of uniform characteristics meeting desired electrical specifications.

The manufacture of transistors involves a number of problems caused by the extreme diminutiveness of the parts making up such devices. For example, the semiconductor die of a transistor is often as small as 0.14 inch in diameter and about 0.006 inch in thickness. Electrodes carried on such a die are usually beads or discs of indium ranging in diameter from about 0.04 inch to about 0.06 inch. The handling and especially the accurate positioning of such small items poses substantial practical problems in transistor assembly operations and in the past has required the employment of highly skilled operators in order that a reasonable yield of satisfactory units may be obtained in production runs. Even skillful and experienced operators have difficulty in handling and accurately aligning the minute components of a transistor so that assembly is normally carried out under a microscope and positioning of the various component parts is often done with the aid of a pantograph or similar expensive instruments to permit minute movement of the parts. All of this naturally adds to the overall expense of transistor manufacture. In addition, because of the difficulties inherent in manipulating the very small articles, transistor manufacturing has often been characterized by rather low yields of satisfactory products and by lack of uniformity in the products of different units manufactured in accordance with the same method.

Largely because of the difficulty inherent in handling minute objects, the assembly of transistors has generally been a hand-assembly operation and has not been particularly well adapted for the utilization of automatic assembly techniques. This, too, has tended to maintain the cost of transistor manufacture at an undesirably high level.

For some applications it is desirable to provide devices which include more than one semiconductor unit. In this manner, a circuit or a portion of a circuit can be integrated into a single electronic device. However, the handling and manipulation problems just referred to become even more severe when assembling a device with more than one semiconductor unit since more component parts are required for the device and the chance of a defect occurring in a given device is increased.

In power transistors, sufficient heat is often generated during operation to affect the electrical characteristics of the unit unless the heat is effectively dissipated. Heat conductive surfaces of relatively large area and heat dissipating capacity have been provided in heat transfer relation with the semiconductor die to carry away the heat generated there. However, since it is normally desired to make very small transistors, the space available for such heat dissipating members must be utilized efficiently.

It is an object of the present invention to provide an improved transistor structure which is particularly well adapted to relatively easy and inexpensive assembly techniques.

It is another object of the invention to provide a power transistor of improved design wherein the maximum available space is afforded for heat transfer means adjacent the transistor electrodes without increasing the overall size of the unit.

It is another object of the invention to provide an improved method for assembling semiconductor devices, such as transistors, of diminutive size which method does not necessitate the employment of highly skilled operators for the obtaining of satisfactory production yields.

It is another object of the invention to provide a method of assembling a semiconductor device whereby alignment of various elements of the transistor with respect to one another takes place automatically so that such alignment is uniform and reproducible in each successive unit fabricated.

It is a further object of the invention to provide a device including more than one semiconductor unit which can be assembled in a reproducible manner on a mass production basis.

It is still another object of the invention to provide an improved method for the assembly of diminutive transistors which method is adapted to automatic assembly techniques.

A feature of the invention is the provision of a method of assembling a semiconductor device including one or more semiconductor units, wherein various elements of the device are stacked vertically on top of one another with adjacent elements in contact and then heated so that the adjacent elements are secured to one another by the softening of certain portions and settle by gravity into positions determined by spacer means arranged between the elements.

Another feature of the invention is the use of a vertically extending annular jig or fixture fitting around the periphery of the mounting base of a diminutive transistor for positioning a plurality of transistor elements in relation to the mounting base and also for the positioning of horizontal spacer means which are used to control the vertical spacing between some of the adjacent transistor elements.

Another feature of the invention is the provision in a transistor of an essentially flat electrode connector member having a projection or boss formed in its surface for contacting the protruding electrode carried on the surface of a semiconductor die positioned adjacent the plate. The projection or boss facilitates the positioning of the connector with respect to the semiconductor die at a predetermined distance from the surface of the die in making connection between the electrode and plate by heating the die thus causing it to soften and become secured to the boss contacting it. The flat surface of the connector member permits it to settle into a desired position on top of horizontal spacer means.

Another feature of the invention is the provision of a power transistor which includes a semiconductor die unit one of whose electrodes rests in contact with a pedestal rising from the mounting base of the transistor with the other electrode having a projection from an electrode connector plate resting on it. The pedestal and the projection provide electrical connection and also serve to carry heat from the semiconductor electrodes to the mounting base and the connector plate both of which are effective heat dissipating means.

Another feature of the invention is the provision of base and electrode connector members with notches on their edges to facilitate their being dropped into a jig in alignment with vertical leads to which the members are secured as by soldering.

A further feature of the invention is the provision of an electronic device which includes at least two semiconductor units mounted on respective connector plates which are spaced vertically from each other and over a mounting base Additional connector plates may be included to provide electrical connections between the semiconductor units and leads, and all of the plates may be assembled by stacking such that the final device has several levels of decks.

Figure 1:
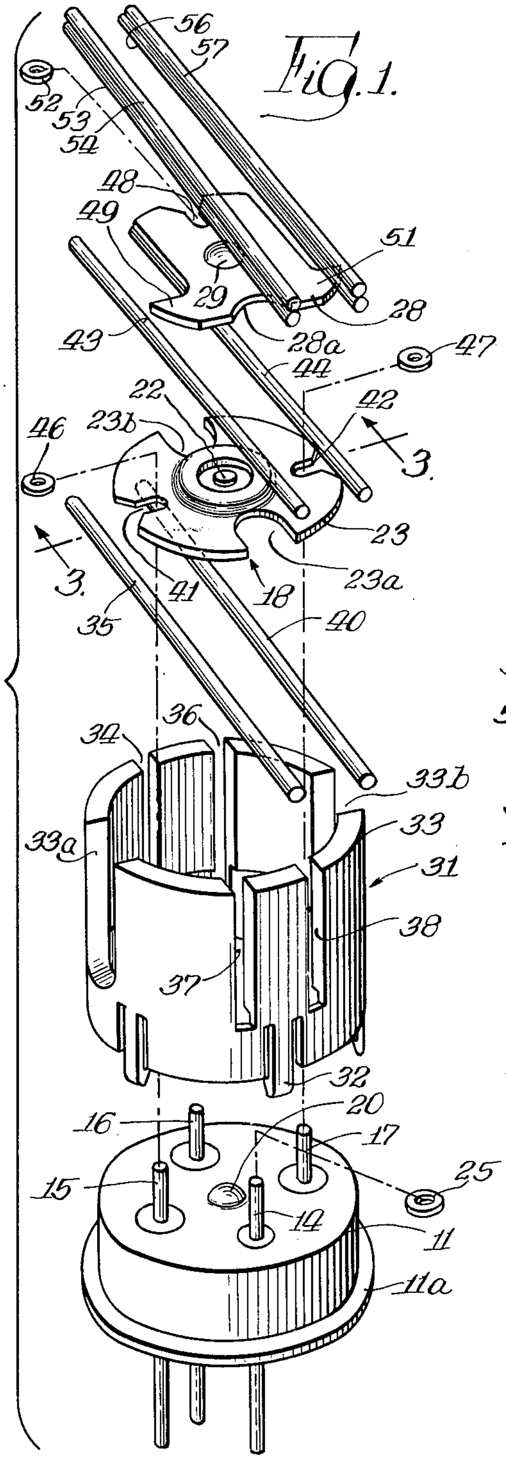
FIG. 1 is an exploded perspective view showing the various parts of a transistor as they are assembled in accordance with one specific embodiment of the present invention.

In accordance with one embodiment of this invention, an improved transistor structure includes a horizontally disposed die with a pair of electrodes on the opposite surfaces thereof. One electrode is secured to a projection rising from the surface of a mounting base and the other secured to a projection from the surface of a horizontally disposed electrode connector plate. The mounting base and the connector plate both serve as effective heat dissipating members so that the improved structure is effective as a power transistor. In another embodiment of the invention, the semiconductor die is disposed between a pair of horizontally disposed connector plates with one electrode secured to a projection from each plate. An additional embodiment includes two semiconductor die elements, and these are arranged with one above the other and with one connector plate between the die elements and other connector plates above and below the die elements.

Assembly of the transistor is accomplished simply, accurately and rapidly by placing an annular jig around the mounting base and successively dropping the various horizontally disposed parts of the transistor into the jig. Slot means formed in the edges of the parts facilitate their alignment with the upright leads of the mounting base to which leads the parts are to be connected. A plate-like carrier for a semiconductor die is dropped onto horizontal spacer means resting on the top surface of the mounting base with an electrode extending from the semiconductor die surface falling onto a projection extending from the conductive metal layer forming the top surface of the mounting base. Additional horizontal spacer means are dropped into the jig followed by the electrode connector plate which falls with the projection from its surface contacting the electrode extending from the upper surface of the die. This assembly of parts is heated to soften the electrodes causing them to flow and be secured to the projections contacting them. At the same time, the parts are secured to the upright leads by the melting of appropriately positioned solder rings. With the parts maintained against transverse movement by their configuration and by the jig and with the vertical movement limited by the spacer means, there is assurance that the desired alignment will be maintained as the parts are secured to one another during the heating operation.

In assembling of the embodiment of the invention including a pair of connector plates, the first connector plate is dropped into the jig onto spacer means in such a position that a projection extends upwardly from its surface. Spacer means are dropped into the jig above the connector plate and the semiconductor die and the other spacer means and the other connector plate dropped into the jig as in the assembly of the other embodiment. A partially assembled unit is then heated to secure the electrodes to the projections they contact.

In assembling all embodiments an alignment of the component parts is self-regulating so that an operator need only drop them into the jig in their proper order to assemble the transistor. This greatly simplifies the assembly process and permits the employment of less skilled labor than is otherwise possible. The use of the spacer bars permits the various components to be accurately and automatically spaced a predetermined vertical distance from one another.

A specific embodiment of this invention is a medium power, audio-frequency transistor, the component parts of which are shown in FIG. 1 of the accompanying drawings in an exploded view illustrating the assembly of such a unit. The transistor includes a generally round mounting base 11 which is made up of a body portion 12 of glass, ceramic or other suitable insulating material and covered with a layer 13 of suitable conductive metal (see FIGS. 5 and 6). In accordance with one embodiment of the invention the layer 13 is of a nickel-iron-cobalt alloy and is covered with a very thin layer of gold (not shown) on the order of 0.000025 inch in thickness. The metal layer 13 covers the top and sides of body portion 12 except for annular portions adjacent the upright mounting leads 14, 15, 16 and 17 to avoid undesired short circuiting of these leads to the metal layer. Leads 14, 15 and 16 extend through the mounting base 11 for subsequent electrical connection to the various elements of the transistor and to provide connection to the circuits in which the transistor will operate. The lead 17 extends only above the surface of the mounting base 11 and serves as a support for one of the elements of the transistor as will be more fully explained later. These leads are made of the same nickel containing alloy as the cover layer 13. An upwardly extending projection or pedestal 20 is formed in the layer 13 centrally of the upper surface of mounting base 11 which surface is substantially flat.

Figures 2, 3, 4:
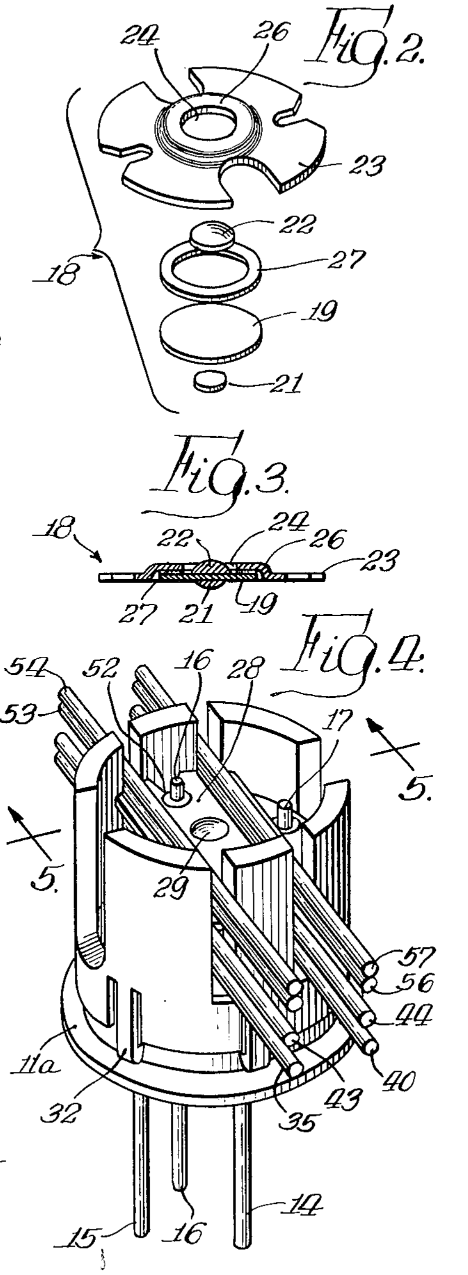
FIG. 2 is an exploded perspective view showing the various parts of a semiconductor die and base connector subassembly illustrated in FIG. 1.
FIG. 3 is a view in section taken on the line 3—3 of FIG. 1.
FIG. 4 is a perspective view showing a transistor in accordance with one embodiment of the invention at one stage of its assembly with the component parts thereof appropriately aligned in a suitable jig.

The transistor further includes a semiconductor die unit 18 which is more fully illustrated in FIGS. 2 and 3. In the particular embodiment illustrated the die unit 18 includes a round flat germanium die 19 of N-type conductivity and with emitter electrode 21 on the one surface thereof and collector electrode 22 on the other surface thereof. The emitter and collector electrodes are beads of indium fused to the respective faces of the germanium die 19 and alloyed to a controlled depth into it by known methods to form a PN junction producing the desired transistor action. If P-type semiconductor material makes up the die 19, the electrodes 21 and 22 are of a suitable donor type impurity metal.

Although a specific embodiment of the present invention includes a semiconductor die in which PN junctions have been formed by alloying a semiconductor die may be used wherein one or both of the junctions has been formed by other methods such as diffusion. In such instances, electrical contacts are carried on the faces of the die and serve simply to establish ohmic contact thereto and do not effect the junction characteristics of the transistor. In the appended claims the term "electrical contacts" includes both such ohmic contacts and alloyed electrodes.

The semiconductor die unit 18 also includes a base connector member 23 provided with a central aperture 24. Connector member 23 is made of an electrically and thermally conductive metal or alloy such as "Kovar" and is covered with a thin coating of gold. The annular portion 26 around the aperture 24 is displaced from the major surface of the connector member 23.

As best shown in FIG. 3, the semiconductor die unit 18 includes the die 19 secured to the annular portion 26 by means of the melted solder ring 27 with the collector electrode 22 extending through the opening 24. The soldered junction forms an ohmic base connection between die 19 and connector 23.

Although FIG. 2 is in the form of an exploded view showing the various component parts of the semiconductor die unit 18 with more clarity, it will be understood that the die unit 18 is preassembled to the form shown in FIGS. 1 and 3 prior to the assembly steps to be described in connection with this invention.

Figures 5, 6, 7, 8, 9, 10:
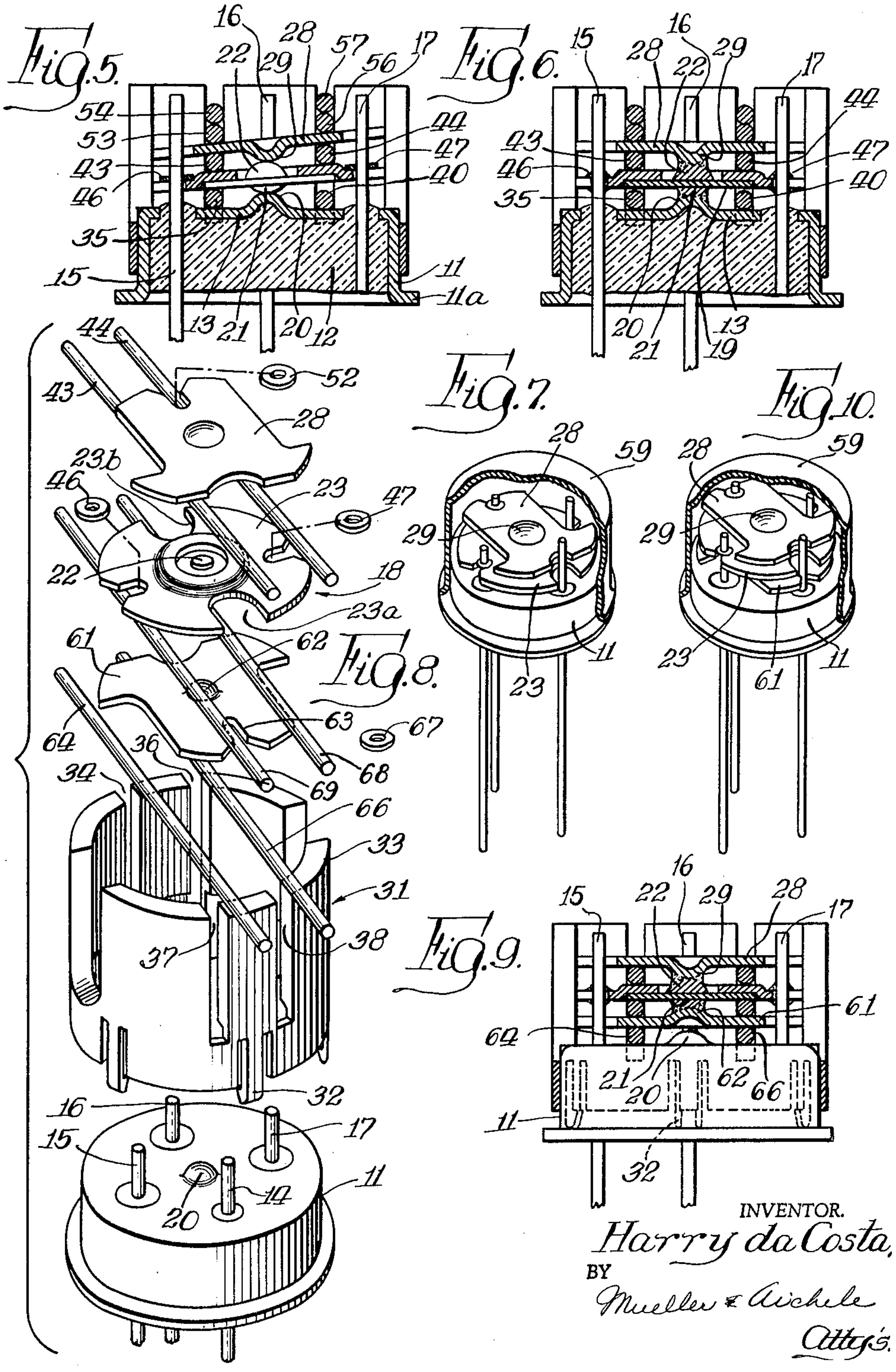
FIG. 5 is a view in section taken on the line 5—5 of FIG. 4.
FIG. 6 is a view similar to FIG. 5 showing the alignment of the various transistor parts after heating of the assembly illustrated in FIG. 5.
FIG. 7 is a perspective view of a finished transistor assembled from the parts illustrated in FIGS. 1–6 and showing the cover member of the transistor broken away to better illustrate the arrangement of the various parts of the completed article.
FIG. 8 is an exploded perspective view showing the various parts of a transistor in accordance with another embodiment of the invention as the parts are assembled.
FIG. 9 is a cross sectional view taken through the jig and mounting base portion of a partially assembled transistor containing the component parts illustrated in FIG. 8 showing the arrangement of the component parts thereof after the aligned components have been heated to secure various of them together.
FIG. 10 is a perspective view of a completed transistor in accordance with the embodiment of the invention illustrated in FIGS. 8 and 9 with the cover member broken away to show the arrangement of the various component parts.

The transistor also includes an electrode connector plate 28 which is made of silver covered with a very thin coating of gold. The substantially flat surface of the connector plate 28 is dimpled to provide a minute boss or projection 29 (as shown in FIGS. 5 and 6) which extends downwardly toward the semiconductor die unit 18. In accordance with one embodiment of the invention, the boss 29 extends 0.02 inch from the surface of plate 28.

In order to appreciate the difficult problems inherent in the assembly of a transistor whose parts are illustrated in FIG. 1, it should be borne in mind that these parts are all extremely small. For example, in one embodiment of the invention the germanium die 19 is only 0.14 inch in diameter. The emitter electrode 21 is only about 0.04 inch in diameter while the somewhat larger collector electrode 22 is 0.06 inch in diameter. The overall diameter of the connector plate 23 is about 0.26 inch. The electrode connector plate 28 will fit within a circumscribed circle of 0.26 inch in diameter.

In accordance with this invention, easy and arcurate alignment of the various parts of the transistor for assembly is accomplished by the use of an annular jig or fixture 31 which is slipped over the mounting base 11 and rests on the annular lip 11*a* as best shown in FIGS. 5 and 6. The jig 31 conforms in shape to the round mounting base 11 and includes spring fingers 32 and a guide portion 33. The guide portion 33 is provided with slots 34, 36, 37 and 38 which extend vertically therethrough and is cut out at portions 33*a* and 33*b* to facilitate dropping parts into the jig. The jig 31 is made of molybdenum or stainless steel and is suitable for reuse with other mounting bases of the same size and shape.

The jig 31 is placed with spring finger 32 on the shoulder 11*a* of the mounting base 11 and resiliently pressing against the sides of the mounting base. The jig is in such a position that none of the upright leads are lined up between the slots that are opposite one another. After the jig 31 is in place, spacer means 35 and 40 are dropped onto the mounting base 11 with spacer 35 fitting into slots 34 and 37 and spacer 40 into slots 36 and 38. Solder ring 25 is dropped over lead 14. The semiconductor die unit 18 is aligned with the slot means 41 and 42 formed in the periphery of connector 23 fitting around leads 15 and 17 respectively and is dropped into the top of the jig 31. Connector plate 23 is also notched along its periphery at 23*a* and 23*b* to provide clearance for leads 14 and 16, respectively. The inside diameter of the guide portion 33 of the jig is such that the semiconductor die unit 18 just fits inside of it with the edges of the connector plate 23 being held against transverse movements by the inner walls of the guide portion 33. The connector plate 23 is thus of substantially the same area as the top surface of the mounting base 11 and so presents a relatively large heat dissipating area within a limited space. The unit 18 is also held against transverse or rotational motion by the leads 15 and 17 fitting in the respective slots 41 and 42. As shown in FIG. 5 the die unit 18 positions itself with emitter electrode 21 resting on the projection 20 of the metal layer 13 forming the upper surface of the mounting base and with the die 19 resting on spacer 35. The metal layer 13 then consitutes a lower electrode connector. This is particularly shown in FIG. 5. It will be understood, of course, that die unit 18 may fall into place tilted in a different direction than shown in FIG. 5 so that die 19 rests on spacer 40.

A second pair of spacer means 43 and 44 are then dropped into the top of the jig with spacer 43 falling into slots 34 and 37 and spacer 44 falling into slots 36 and 38. In the embodiment of the invention illustrated the spacer means are made of 0.02 inch diameter drawn stainless steel wire and about 0.5 inch long so that they exend beyond the jig as shown in FIG. 4. The spacer means may be made of other suitable material such as molybdenum and may be of different diameter or thickness for other embodiments of the invention in which different spacing between the various component parts of the transistor is desired for any reason. Spacer means 43 and 44 rest on the connector plate 23 of semiconductor die unit 18 as shown in FIG. 5.

A pair of solder rings 46 and 47 are threaded over leads 15 and 17 respectively and dropped onto connector plate 23 as shown in FIG. 5.

The upper electrode connector plate 28 is aligned with its slot means 48 around lead 16 and is dropped into the top of the jig 31 being guided along its edges by the inner walls of the guide portion 33. The configuration of plate 28 is such that the arm portions 49 and 51 and the portions adjacent the slot 48 and notch 28*a* fit against the inner walls of the guide portion 33. Thus the connector plate 28 is so shaped as to provide a maximum heat dissipating area consistent with permitting adequate spacing from the leads to which it is not connected. Plate 28 is notched at 28*a* to provide clearance for lead 14 with leads 15 and 17 extending between arm portions 49 and 51 and the main body of the plate. The centrally located and downwardly extending projection 29 of the plate 28 falls into contact with the upwardly extending collector electrode 22. The plate 28 may align itself in a somewhat tilted position as shown in FIG. 5. Solder ring 52 is threaded over upright lead 16 and dropped onto the surface of plate 28.

Two additional pairs of spacer means 53, 54, 56 and 57 are dropped into the slots of the jig 31 on top of the plate 28 in order to provide weight for holding the parts of the unit in proper alignment as they are secured together.

A perspective view of the partially assembled transistor at this stage of the process is shown in FIG. 4 with the various component parts stacked inside the jig and with the spacer means protruding through the slots beyond a jig. The subassembly illustrated in FIG. 4 is heated in order to soften the metal electrodes 21 and 22 so that they flow and are secured to the respective projections they contact and to melt the solder rings to affix the various parts to the appropriate leads thus establishing the desired electrical and mechanical connections. In accordance with one embodiment of the invention, the heating step is accomplished by passing the partially assembled transistor unit through a suitable furnace wherein it is heated in a non-oxidizing atmosphere to a temperature of about 300° C. This temperature is sufficient to soften the indium electrodes 21 and 22 for securing them to the projections they contact as well as to melt the various solder rings to affix base connector plate 23 to leads 15 and 17 and to affix plate 28 to the lead 16. During the heating step, the indium electrodes 21 and 22 become soft so that the base connector plate 23 and the semiconductor die unit 18, which in effect is supported on the pedestal 20 by the emitter electrode 21, vertically as electrode 21 softens and flows over the pedestal 20. The die unit 18 settles until it rests on spacers 35 and 40 positioned on the top surface of mounting base 11. At the same time connector plate 28, whose projection 29 rests on collector electrode 22, also settles vertically due to the softening of the collector electrode. Spacers 43 and 44 settle along with the base connector 23 on which they rest and serve to limit the extent to which the connector plate 28 can settle. Thus, the spacers accurately position semiconductor die unit 18 and control the vertical spacing between it and the main surface of the metal layer 13 on one side and the electrode connector plate 28 on the other.

It would be undesirable for either the electrode connector plate 28 or the metal layer 13 to come into direct contact with the germanium die 19, but, at the same time, the conducting path through the electrode should be as short as feasible so that it is desired to provide spacing in the order of 0.02 inch between the electrode connector means and the die. The use of spacer means to control the settling of the semiconductor die unit 18 and the plate 28 permits such close and accurate spacing to be obtained easily and automatically. Different spacing can be obtained if desired, by providing spacers of different thickness since the thickness of the intervening spacer determines the distance between the die and the electrode connector members.

During the settling operation the semiconductor die unit 18 and the electrode connector plate 28 align themselves into horizontal positions as shown in FIG. 6 and the electrodes flow around the contiguous projections to form the electrical connections indicated. Solder ring 25 which has been threaded over the lead 14 melts to form an electrical connection between the lead 14 and the conductive metal layer 13 from which the pedestal 20 has been formed. This establishes electrical connection through the pedestal 20 and the layer 13 between emitter electrode 21 and lead 14. In this way the layer 13 serves as the emitter connector member.

During the heating steps solder rings 46 and 47 melt and secure plate 23 to leads 15 and 17 and establish a base connection to the lead 15. The melting of solder rings 52 connects plate 28 to lead 16 and thus establishes a connection between lead 16 and the collector electrode

22. In addition to establishing electrical connection the melted solder rings also mechanically affix the plates 23 and 28 in predetermined position on the upright leads which position has been established by the horizontal spacer means.

After the securing and settling operation has been completed, the unit is cooled, the spacers withdrawn from the jig 31 and the jig lifted from the mounting base. The partially assembled unit is then subjected to such etching, cleaning, or coating treatment as is desired. A suitable cover 59 of mild steel or other suitable metal is then affixed to the shoulder 11*a* of the mounting base by welding or soldering. The completed transistor is illustrated in FIG. 7, the base connector plate 23 and the electrode connector plate 28 being horizontally aligned and vertically spaced a predetermined distance from one another and from mounting base 11 with the plate 28 in electrical connection with collector electrode 22 and with emitter electrode 21 in electrical connection with pedestal 20. Heat generated at the emitter junction during operation of the transistor is effectively dissipated through layer 13 to glass body 12 which is an efficient heat sink. Heat generated at the collector electrodes is dissipated through plate 28.

In some instances it is desirable to fill the space inside the cover 59 with a suitable heat transfer liquid such as a silicone oil. This is done by introducing the liquid through a hole formed in the cover 59 after it has been attached to the mounting base 11 or by inverting the cover, introducing a predetermined amount of liquid into it, lowering the unit into the cover and then securing the cover to the mounting base.

Since emitter electrode 21 is connected to the pedestal 20, it is necessary to establish an electrical connection between emitter lead 14 and pedestal 20 through metal layer 13. This may be done by the melting of solder ring 25 as previously explained or in a number of other ways. For example, a mounting base may be provided in which there is no annular exposed glass area around emitter lead 14 as there is around the other leads so that the lead is in direct contact with metal layer 13. In accordance with another embodiment, the lead 14 is bent over and its end soldered to metal layer 13. Still another method of establishing this connection is through a conductive strip across the bottom surface of insulating body 12 between the lead 14 and the portion of the metal layer 13 covering the sides of the insulating body.

In accordance with another embodiment of the invention particularly illustrated in FIGS. 8–10, the emitter electrode is not connected to a pedestal formed in the mounting base but to a projection rising from the surface of an electrode connector plate similar to the plate 28. This embodiment provides additional heat transfer area. As shown in FIG. 8 this embodiment of the invention utilizes the same parts as the embodiment just described including a mounting base 11 having a pedestal 20 rising from the upper surface thereof. In the latter embodiment of the invention the pedestal 20 serves no function, however, it is desirable that identical mounting bases be usable in either embodiment.

The latter embodiment of the invention includes the same component parts described in connection with the former embodiment and in addition includes electrode connector plate 61 which has a projection 62 rising from its surface. In addition plate 61 has slot means 63 formed in its edge. Connector plates 28 and 61 are identical and differ only in the way in which they are positioned. Projection 62 is so formed as to fit over the pedestal 20 as shown in FIG. 10 so that plate 61 will not come in contact with the mounting base 11.

In assembly of the transistor unit a pair of spacer means 64 and 66 are dropped into the jig 31 onto the upper surface of the mounting base 11. Plate 61 which serves as the emitter connector plate is aligned with the slot 63 fitting around lead 14 and dropped into the jig onto spacers 64 and 66. Solder ring 67 is then threaded over the lead 14 and dropped onto plate 61. Spacers 68 and 69 are dropped into the jig onto the plate 61 and the semiconductor die unit 18 aligned with leads 16 and 17 and dropped into the jig with the emitter electrode 21 falling against the projection or boss 62. Solder rings 46 and 47 are threaded around leads 15 and 17 respectively, spacers 43 and 44 are dropped into the jig and plate 28 which serves as the collector electrode connector is dropped into place with its projection 29 resting on the collector electrode 22 in the same manner as has been previously described. Although not shown in FIG. 8, additional spacers may be placed on top of plate 28 to weigh down the assembled plate. The partially assembled unit is heated as before with the emitter electrodes softening so that emitter electrode 21 flows around projection 62 of plate 61 and the base connector plate 23 settles vertically due to the softening of the supporting electrode 21. The amount of settling is controlled by the spacers 68 and 69. Likewise the settling of the plate 28 due to softening of electrode 22 is controlled by spacers 43 and 44 as in the case of the previously described embodiment. Although the electrode connector plates 28 and 61 and the base connector plate 23 may not align themselves in a parallel horizontal orientation on being dropped into the jig, this orientation will be assumed during the settling which takes place during the heating operation and after such heating the component parts will be aligned as shown in FIG. 10. The heating also melts the appropriate solder ring and connects emitter connector plates 62 to emitter lead 14, the base connector plate 23 to base lead 15 and the electrically inactive supporting lead 17 as well as connecting collector connector plate 28 to collector lead 16.

After the assembly has been cooled the spacer bars are withdrawn from the jig, the jig removed from the mounting base and a suitable cover 59 attached to the mounting base to form the finished transistor unit illustrated in FIG. 9. This unit is assembled as easily as that shown in FIG. 7 requiring only the addition of one part and the use of an additional pair of spacer bars.

Figure 12:
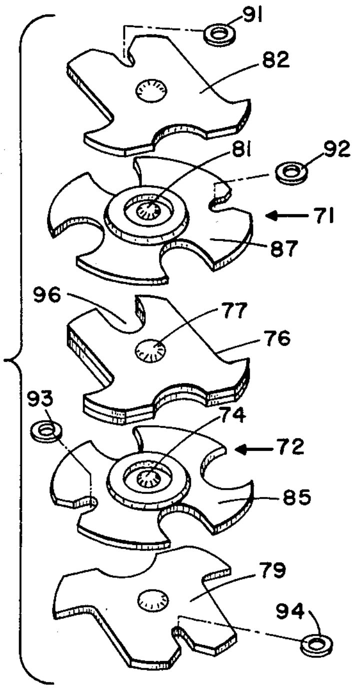
FIG. 12 is an exploded perspective view of the internal component parts of the device of FIG. 11 as they are arranged for assembly.
Figure 11:
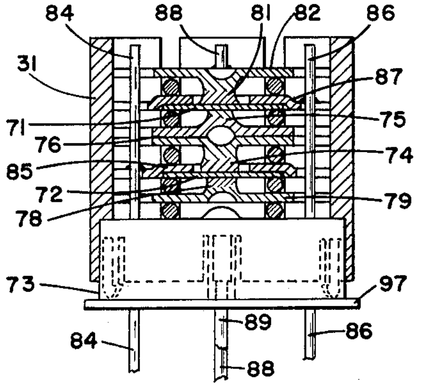
FIG. 11 is a sectional view of another embodiment of the invention which includes two semiconductor units shown at a stage of assembly wherein the parts thereof have been aligned and secured together.

FIGS. 11 and 12 illustrate an embodiment which includes two semiconductor die units 71 and 72 that are spaced vertically from each other above the mounting base 73. In this embodiment, the emitter electrode 74 of the die unit 72 is electrically common with the collector electrode 75 of the die unit 71. The electrodes 74 and 75 are connected together electrically by a connector 76 which is located between the die units 71 and 72. The connector 76 as shown in FIGS. 11 and 12 consists of two connector plates, similar to the plate 28 of FIG. 1, joined together so that there is a projection 77 on each side of the connector. Two such plates may be joined by brazing, sweating or coining for example. The electrodes 74 and 75 are fused to the respective projections of the connector 76.

The collector electrode 78 of the die unit 74 is fused to a connector plate 79 which is located just above the mounting base 73, although it will be understood that the electrode 78 could be fused directly to the metallic material of the mounting base. The emitter electrode 81 of the die unit 71 is fused to another connector plate 82 at the top of the device. Thus, it may be seen that the two semiconductor die units 71 and 72 are connected to each other in series circuit relation, with the emitter of one unit connected to the collector of the other.

The mounting base 73 has four leads 84, 86, 88 and 89 extending through it. The leads are arranged in the same manner as those of the mounting base 11 of FIG. 1, except that all four leads project on both sides of the header and are insulated from it. The lead 84 is soldered to the base connector member 85 for the semiconductor die unit 72, and thus serves as a base lead. The lead 86 serves as a base lead for the other semiconductor die unit 71 and is soldered to the base connector member 87 for that unit. The lead 88 is soldered to the emitter connector member 82 for the semiconductor die unit 71, and serves as an emitter lead for that unit.

In FIG. 11, only that portion of the fourth lead 89 which projects from the bottom of the header 73 is shown, but it will be understood that another portion of this lead projects from the top of the header. The top portion of the lead 89 has been omitted in FIG. 11 in order to show the sectional configuration of the connector plates and the die units. The fourth lead 89 is soldered to the collector connector member 79 for the die unit 72. The soldering of the connector plates to the corresponding leads is accomplished by providing solder rings 91–94 at the junctures of the leads and connector members when the device is assembled, and subjecting the assembly to heat in a heating operation as previously described.

It may be seen that the device of FIG. 11 has two base leads 84 and 86, a lead 88 for the emitter of the semiconductor die unit 71 and a lead 89 for the collector of the semiconductor die unit 72. A device of this type having two transistor elements connected in series with an emitter-to-collector connection between the units, is useful for several circuit applications. For example, a load such as a resistor may be connected to the collector lead 88 and a source of voltage may be connected to the emitter lead 89. Input signals may be supplied to the two base electrodes 84 and 86 in order to control the conduction of the transistor elements. The device may be employed, for example, in a switching circuit in which both transistor elements are turned on simultaneously to supply current to a load, and are turned off to interrupt that current.

Figure 14:
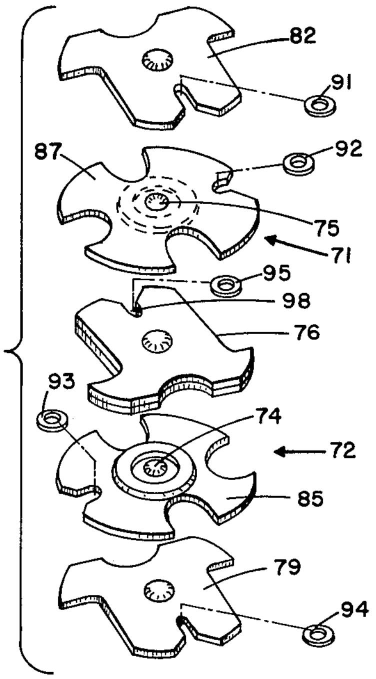
FIG. 14 is an exploded perspective view of the internal component parts of the device of FIG. 13.
Figure 13:
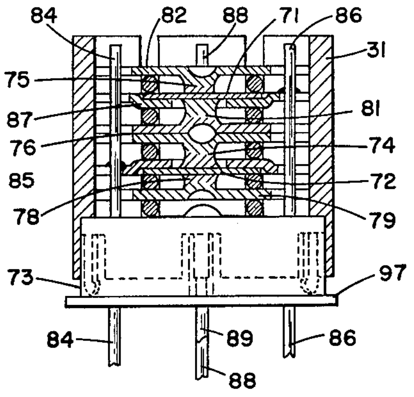
FIG. 13 is a section view of a modified form of the device of FIG. 11.

FIGS. 13 and 14 illustrate a device having two semiconductor die units 71 and 72 electrically connected in parallel circuit relation. The component parts of the embodiment of FIGS. 13 and 14 are essentially the same as those of the embodiment of FIGS. 11 and 12, and therefore the same reference numerals have been used for the two embodiments.

In the embodiment of FIGS. 13 and 14, the component parts are oriented somewhat differently than in the embodiment of FIGS. 11 and 12. For instance, semiconductor die unit 71 is inverted in FIG. 13 as compared to FIG. 11. It may be seen that the emitter electrode 81 of this die unit is fused to an intermediate connector 76, and the emitter electrode 74 of the other die unit 72 is also fused to the intermediate connector 76. Thus, the two emitter electrodes are connected in electrically common relation with each other by the connector 76. That connector in turn is secured to the lead 88 by solder which originally is in the form of a ring 95 as shown in FIG. 14.

The collector electrodes 75 and 78 are also connected in electrically common relation with each other. The electrode 75 is fused to the connector plate 82, and the electrode 78 is fused to the connector plate 79. The two plates 79 and 82 are connected to the same lead 89 by means of the solder rings 91 and 94.

The base connector members 85 and 87 are soldered respectively to the two base leads 84 and 86 in the same manner as has been described in connection with FIG. 11. The connector 76 of FIGS. 13 and 14 includes a narrow slot 98 through which the lead 84 extends, and a soldered connection is made at this slot. The connector 76 of FIGS. 11 and 12 has a larger cut-out portion 96 through which the lead 84 extends without contacting the member 76. The other component parts of the two devices are identical except that they are positioned differently, as has been described.

The device of FIGS. 13 and 14 may be operated as a switching device in which the two transistor elements are turned on and off independently. An electrical load, such as a resistor, may be connected to the collector lead 88, and a source of supply voltage may be connected to the emitter lead 89. Input signals may be applied to the base leads 84 and 86 for controlling the conduction of the transistors, and the device may serve a gating function, for example. It is possible to provide independent leads for the two collector electrodes 75 and 78 by adding a fifth lead to the header and connecting it to one of the plates 79 and 82. Such a device may be employed in a switching circuit of the multivibrator type.

In assembling the devices of FIGS. 11–14, the various component parts are stacked vertically on the mounting base 73 together with spacer members in the same manner as has been described in connection with FIGS. 1–10. After the various elements have been assembled in an aligned condition, the assembly is subjected to heat and is then cooled in order to melt and then solidify the solder and to fuse the emitter and collector electrodes to the corresponding connector plates. As a final step, a cover is secured to the shoulder 97 of the mounting base by welding or soldering so as to form a sealed enclosure for the semiconductor units and the connector plates.

Although connector plates of metal have been described, it will be understood that the plates need not be entirely of metal. For example, plates of alumina having metallized surfaces may be used if desired. Similarly, the spacer elements need not be in the form of wires, although wires are convenient and facilitate the assembly operation.

The present invention provides a transistor of improved design which is particularly adapted to a relatively inexpensive and convenient assembly procedure in which various parts of the transistor are self-aligning during assembly and are held by gravity in their proper positions during the process of affixing them to one another. The improved structure and fabrication method enables the transistor to be manufactured with a high degree of uniformity and a high yield of electrically satisfactory products. At the same time the process of assembly can be carried out by relatively unskilled and inexperienced operators without the aid of expensive assembly equipment.

Various structural features of this invention also provides other advantages particularly applicable to power transistors since the arrangement of the heat dissipating member efficiently utilizes space available for heat dissipation. This permits the transistor to be contained in the smallest possible package consistent with electrostatic requirements. The invention is applicable to semiconductor devices other than power transistors, and is also applicable to devices of the type which include more than one semiconductor unit.

I claim:

1. A method of assembling a multi-piece semiconductor device which includes a semiconductor die assembly having a pair of opposite faces with at least one electrode on each of said faces and a mounting base having mounting leads extending vertically through said mounting base and supported therein, said method comprising the steps of enclosing said mounting base in a hollow cylindrical jig having a vertical dimension such that it extends above the mounting leads of the base, said jig having a plurality of slots in the sides thereof aligned oppositely with respect to one another and extending downwardly from the top of the jig to a point spaced a predetermined distance above the upper surface of said mounting base, dropping a first group of spacers into said jig at said slots with a single spacer in each pair of oppositely aligned slots, dropping a first electrode connector member into the open top of said hollow cylindrical jig and positioned with relation to and engaging a first mounting lead on the mounting base, said first electrode connector member falling onto said first group of spacers and guided by the sides of said jig, dropping a first solder ring over a mounting lead and into contact with said first electrode connector member, dropping a second group of spacers into slots of said jig with a pair of oppositely aligned slots retaining one spacer, dropping a semiconductor die assembly into the top of said jig to fall guided by said jig so that an electrode on a die assembly face rests in contact with said first electrode connector member, dropping a second solder ring over a mounting lead and into contact with said die assembly, dropping a third group of spacers into slots of said jig with a pair of oppositely aligned slots retaining one spacer therein, dropping a second electrode connector member into the top of said jig positioned by a vertical mounting lead and guided by the sides of said jig as it descends in said jig so that it rests on an electrode on said die assembly on the opposite face thereof, dropping a third solder ring over a mounting lead and into contact with the second electrode connector member, heating the jig and the assembly in the jig to soften said electrodes to effect settling of said vertically assembled pieces in the jig including the spacers to establish accurately predetermined vertical spacing between said pieces with said heating also melting said solder rings for making electrical and mechanical connection between said electrode connectors and respective mounting leads and between said die assembly and said mounting base, cooling the jig and assembled pieces therein to harden the softened and melted material, removing the spacers from the jig, and separating the assembled semiconductor device from the jig.

2. A method of fabricating an electronic device which includes a plurality of vertically positioned and electrically and mechanically connected portions, said method including the steps of providing a cylindrical hollow fixture with a plurality of slots opening from the top of said fixture and extending a predetermined distance downwardly therefrom, enclosing one of said plurality of portions with said fixture at the bottom portion of the fixture, placing in pairs of oppositely-aligned ones of said slots spacer members which extend entirely across the fixture, dropping into said cylindrical hollow fixture from the top thereof a second one of said device portions and permitting it to drop therein and guided by the fixture, again placing in pairs of oppositely-aligned ones of said slots spacer members which extend entirely across the fixture and are free to drop downwardly until resting on a device portion, dropping into said cylindrical hollow fixture another of said plurality of portions to rest on the last named spacer members, providing meltable material between the vertically spaced apart portions but out of contact with the spacer members, heating the fixture and that within the fixture to melt the meltable material and secure the portions into an electronic device assembly, cooling the assembly, and separating the assembled electronic device from the fixture and the spacer members.

3. A method of fabricating an electronic device which includes a plurality of vertically stacked portions electrically and mechanically connected over at least a portion of each stacked portion to provide a single assembly thereof, said method including the steps of providing a cylindrical hollow fixture with a plurality of slots extending downwardly in the wall from the top thereof and placed therein so that said slots are oppositely positioned in pairs in the wall, successively but interruptedly dropping portions of the electronic device-assembly into said fixture from the top thereof to be positioned in a stacked relation therein, intermediate the steps of dropping said portions, the steps of placing between each two vertically positioned portions a plurality of wire-like spacers to space portions in a vertical direction and establish and maintain such portions at predetermined horizontal levels relative to one another in the fixture, connecting vertically spaced portions into a single electronic device assembly by meltable material while maintaining said portions in said fixture, and separating said wire-like spacers and said fixture from the electronic device assembly.

4. A method of fabricating an electronic device which includes a plurality of vertically stacked portions electrically and mechanically connected over at least a part of each to provide a single assembly thereof, said method including the steps of enclosing a mounting portion for the assembly with a cylindrical hollow open-top fixture having a plurality of slots extending downwardly in the wall from the top of the wall, placing in said fixture in interrupted successive steps a plurality of device portions to be positioned vertically therein, placing in the slots of said fixture in steps taken intermediate said interrupted steps spacer members which extend entirely across the fixture and with a single spacer member positioned in each of two oppositely aligned slots and lying intermediate two vertically stacked portions, maintaining said spacer members and said vertically stacked device portions within the fixture while connecting the stacked portions by meltable material into a single assembly with the spacer members determining the vertical spacing between adjacent stacked portions engaged by the spacer members, and the step of separating the single assembly from the fixture and spaced members after the meltable material is hardened.

5. An annular fixture for use in aligning diminutive parts in the assembly of semiconductor devices, said fixture including an annular walled guide portion adapted to fit around and extend above the mounting base of a semiconductor device, said guide portion being of a diameter such as to guide semiconductor-device parts dropped into said fixture into a desired position therein and to hold such parts against transverse movement during their assembly into a semiconductor device, said annular wall of said fixture having a plurality of vertical slots therein adapted to accommodate removable spacer members, and a plurality of wire-like spacer members adapted to be dropped into the vertical slots with one member in each pair of slots oppositely aligned in said annular wall with the spacer members to be used in the vertical positioning of semiconductor device parts relative to one another.

6. A fixture for use in aligning parts during the assembly of semiconductor devices and adapted to fit around and extend above a mounting base for the semiconductor device, said fixture including a walled enclosing-member open at the top and at the bottom thereof and having a plurality of vertical slots in the wall thereof oppositely aligned relative to one another and opening downwardly from the top of the wall, said slots accommodating therein a plurality of spacer members, and a plurality of wire-like spacer members which are each longer than the outside transverse dimension of the walled enclosing member so that each extends beyond the walled member when placed in two oppositely aligned slots, with said spacer members when assembled in said fixture with parts for a semiconductor device acting to align parts of a semiconductor device in a horizontal direction and to space said parts vertically in the enclosing member of said fixture, and said walled enclosing member having an inside transverse dimension such as to maintain parts therein against transverse movement.

References Cited by the Examiner

UNITED STATES PATENTS

| | | | |
|---|---|---|---|
| 2,762,001 | 9/56 | Kilby | 317—235 |
| 2,771,663 | 11/56 | Henry. | |
| 2,876,401 | 3/59 | Fuller | 317—235 |
| 3,060,553 | 10/62 | Kelly | 29—25.3 |

JOHN F. CAMPBELL, *Primary Examiner.*